US009545005B2

United States Patent
Park et al.

(10) Patent No.: US 9,545,005 B2
(45) Date of Patent: Jan. 10, 2017

(54) MULTILAYER CERAMIC ELECTRONIC COMPONENT AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Sang Soo Park, Suwon-Si (KR); Min Cheol Park, Suwon-Si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 239 days.

(21) Appl. No.: 14/247,984

(22) Filed: Apr. 8, 2014

(65) Prior Publication Data

US 2015/0131253 A1    May 14, 2015

(30) Foreign Application Priority Data

Nov. 14, 2013    (KR) ................. 10-2013-0138632

(51) Int. Cl.
*H01G 4/30*    (2006.01)
*H01G 4/005*    (2006.01)
(Continued)

(52) U.S. Cl.
CPC ............. *H05K 1/141* (2013.01); *H01G 2/06* (2013.01); *H01G 4/005* (2013.01); *H01G 4/01* (2013.01);
(Continued)

(58) Field of Classification Search
CPC .......... H01G 4/30; H01G 4/005; H01G 4/002; H01G 4/228; H01G 4/232; H01G 4/236; H01G 4/06; H01G 4/018; H01G 4/08; H01G 4/12; H01G 4/1209
(Continued)

(56) References Cited

U.S. PATENT DOCUMENTS

| | | | |
|---|---|---|---|
| 2004/0066589 A1* | 4/2004 | Togashi | H01G 2/065 361/15 |
| 2007/0025053 A1* | 2/2007 | Takahashi | H01G 4/012 361/303 |

(Continued)

FOREIGN PATENT DOCUMENTS

| | | |
|---|---|---|
| JP | 10-505547 A | 6/1998 |
| JP | 2004-134430 A | 4/2004 |

(Continued)

OTHER PUBLICATIONS

Korean Office Action ussed in Korean Application No. 10-2013-0138632 dated Oct. 7, 2014, w/English translation.

(Continued)

*Primary Examiner* — Binh Tran
(74) *Attorney, Agent, or Firm* — McDermott Will & Emery LLP (57) ABSTRACT

A multilayer ceramic electronic component may include: a multilayer ceramic capacitor including a ceramic body in which a plurality of dielectric layers are stacked, a pair of first external electrodes and a pair of second external electrodes formed on both side surfaces of the ceramic body and extended to portions of a mounting surface of the ceramic body, and first and second internal electrodes alternately stacked, having the dielectric layer therebetween, exposed through at least one side surface of the ceramic body, and connected to the first and second external electrodes, respectively; and an interposer substrate including an insulation substrate bonded to the mounting surface of the multilayer ceramic capacitor, and first and second connection terminals formed on the insulation substrate and connected to the first and second external electrodes, respectively.

28 Claims, 6 Drawing Sheets

(51) Int. Cl.
- *H01G 4/236* (2006.01)
- *H05K 1/14* (2006.01)
- *H01G 4/01* (2006.01)
- *H01G 4/228* (2006.01)
- *H01G 2/06* (2006.01)
- *H01G 4/232* (2006.01)
- *H01G 4/06* (2006.01)
- *H05K 1/18* (2006.01)

(52) U.S. Cl.
CPC .............. *H01G 4/228* (2013.01); *H01G 4/232* (2013.01); *H01G 4/236* (2013.01); *H01G 4/30* (2013.01); *H05K 1/144* (2013.01); *H05K 1/181* (2013.01); *H05K 2201/049* (2013.01); *H05K 2201/10015* (2013.01); *H05K 2201/10378* (2013.01)

(58) Field of Classification Search
USPC ............... 361/301.4, 303, 306.1, 306.3, 307, 308.1, 361/311–313, 321.1, 321.2
See application file for complete search history.

(56) References Cited

U.S. PATENT DOCUMENTS

2009/0086403 A1* 4/2009 Lee ................. H01G 4/012
                                              361/301.4
2009/0168303 A1    7/2009 Yoshida et al.
2011/0180317 A1    7/2011 Takahashi et al.
2013/0284507 A1   10/2013 Hattori et al.
2014/0016242 A1    1/2014 Hattori et al.
2014/0124256 A1    5/2014 Hattori et al.

FOREIGN PATENT DOCUMENTS

| | | |
|---|---|---|
| JP | 2009-164168 A | 7/2009 |
| JP | 2012-054330 A | 3/2012 |
| JP | 5012658 B2 | 6/2012 |
| JP | 2012-204572 A | 10/2012 |
| KR | 10-2007-0119893 A | 12/2007 |
| KR | 1020110043780 A | 4/2011 |
| WO | 2012/090986 A1 | 7/2012 |
| WO | 2013/008550 A1 | 1/2013 |

OTHER PUBLICATIONS

Japanese Office Action issued in Japanese Application No. 2014-077020 dated Oct. 6, 2015, with English Translation.

* cited by examiner

MULTILAYER CERAMIC ELECTRONIC COMPONENT AND BOARD HAVING THE SAME MOUNTED THEREON

CROSS-REFERENCE TO RELATED APPLICATION

This application claims the benefit of Korean Patent Application No. 10-2013-0138632 filed on Nov. 14, 2013, with the Korean Intellectual Property Office, the disclosure of which is incorporated herein by reference.

BACKGROUND

The present disclosure relates to a multilayer ceramic electronic component and a board having the same mounted thereon.

Multilayer ceramic capacitors, multilayer chip electronic components, are a chip type condensers mounted on circuit boards of several electronic products such as display devices, for example, liquid crystal displays (LCDs), plasma display panels (PDPs), and the like, computers, personal digital assistants (PDAs), cellular phones, and the like, to serve to charge or discharge electricity therein or therefrom.

The multilayer ceramic capacitor (MLCC) may be used as a component of various electronic devices due to advantages such as a small size, high capacitance, and easiness of mounting.

The multilayer ceramic capacitor may have a structure in which a plurality of dielectric layers, and internal electrodes having different polarities, to have a dielectric layer therebetween, are alternately stacked.

Since the dielectric layer has piezoelectric and electrostrictive properties, a piezoelectric phenomenon may occur between the internal electrodes when a direct current (DC) or alternating current (AC) voltage is applied to the multilayer ceramic capacitor, such that vibrations may be generated.

The vibrations may be transferred to a circuit board on which the multilayer ceramic capacitor is mounted through external electrodes of the multilayer ceramic capacitor, such that the entire circuit board acts as a sound reflective surface to generate vibration sound, noise.

The vibration sound may correspond to an audio frequency in a range of 20 to 20,000 Hz, causing listeners discomfort. The vibration sound causing listeners discomfort as described above is referred to acoustic noise.

SUMMARY

Some embodiments of the present disclosure may provide a multilayer ceramic capacitor capable of reducing acoustic noise.

According to some embodiments of the present disclosure, a multilayer ceramic electronic component may include: a multilayer ceramic capacitor including a ceramic body in which a plurality of dielectric layers are stacked, a pair of first external electrodes disposed on first and second side surfaces of the ceramic body, respectively a pair of second external electrodes disposed on the first and second side surfaces of the ceramic body, respectively, wherein one of the first external electrodes and one of the second electrodes disposed on the first side surface are spaced apart from each other in a length direction of the ceramic body and extended to portions of a mounting surface of the ceramic body, and first and second internal electrodes alternately stacked in the ceramic body, exposed through at least one of the first and second side surfaces of the ceramic body, and connected to one of the first and second external electrodes, one of the plurality of dielectric layers being disposed between the first and second internal electrodes; and an interposer substrate including an insulation substrate connected to the mounting surface of the multilayer ceramic capacitor, and first and second connection terminals formed on the insulation substrate and connected to the first and second external electrodes, respectively.

At least one corner part of the interposer substrate may be provided with a margin part in which the connection terminal is not formed.

The first and second connection terminals of the interposer substrate may include: first and second connection portions formed on an upper surface of the insulation substrate so as to be connected to the first and second external electrodes, respectively; and first and second terminal portions extended from the first and second connection portions to a lower surface of the insulation substrate.

The first and second connection terminals may include conductive adhesion layers formed on the first and second connection portions.

The conductive adhesion layers may contain a conductive resin or a high melting point solder.

The first and second connection terminals may be exposed to both ends of the insulation substrate.

The first and second connection terminals may be exposed to both ends of the insulation substrate and have grooves depressed inwardly from both ends of the insulation substrate.

The first and second connection terminals may include plating layers formed on the first and second terminal portions.

The plating layers of the first and second terminal portions may include a nickel plating layer and a gold plating layer formed in sequence.

The multilayer ceramic capacitor may include plating layers formed on the first and second external electrodes.

In the case of the multilayer ceramic capacitor, the first and second internal electrodes may have two lead-out portions exposed to both side surfaces of the ceramic body, respectively.

In the multilayer ceramic capacitor, the first and second internal electrodes may have lead-out portions opposing each other in a diagonal direction of the ceramic body.

The multilayer ceramic capacitor may include upper and lower cover layers formed on upper and lower surfaces of the ceramic body, respectively.

The interposer substrate may have an area smaller than that of the mounting surface of the multilayer ceramic capacitor.

According to some embodiments of the present disclosure, a board having a multilayer ceramic electronic component mounted thereon, the board may include: a substrate having first and second electrode pads formed thereon; and a multilayer ceramic electronic component mounted on the substrate, wherein the multilayer ceramic electronic component includes: a multilayer ceramic capacitor including a ceramic body in which a plurality of dielectric layers are stacked, a pair of first external electrodes disposed on first and second side surfaces of the ceramic body, respectively a pair of second external electrodes disposed on the first and second side surfaces of the ceramic body, respectively, wherein one of the first external electrodes and one of the second electrodes disposed on the first side surface are spaced apart from each other in a length direction of the ceramic body and extended to portions of a mounting surface of the ceramic body, and first and second internal electrodes alternately stacked in the ceramic body, exposed through at least one of the first and second side surfaces of the ceramic body, and connected to one of the first and second external electrodes, one of the plurality of dielectric layers being disposed between the first and second internal electrodes; and an interposer substrate including an insulation substrate connected to the mounting surface of the multilayer ceramic capacitor, and first and second connection terminals formed on the insulation substrate and connected to the first and second external electrodes, respectively.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined to clearly describe the exemplary embodiments of the present disclosure. T, L, and W shown in the drawings refer to a thickness direction, a length direction, and a width direction, respectively. A direction in which dielectric layers are stacked may refer to a 'stacking direction'.

In addition, in the exemplary embodiment of the present disclosure, for convenience of explanation, surfaces of a ceramic body opposing each other in the thickness direction thereof may be defined as upper and lower surfaces, surfaces thereof opposing each other in the length direction may be defined as end surfaces, and surfaces opposing each other in the width direction of the ceramic body may be defined as both side surfaces. Here, the lower surface may be defined as a mounting surface.

Multilayer Ceramic Electronic Component

Figure 1:
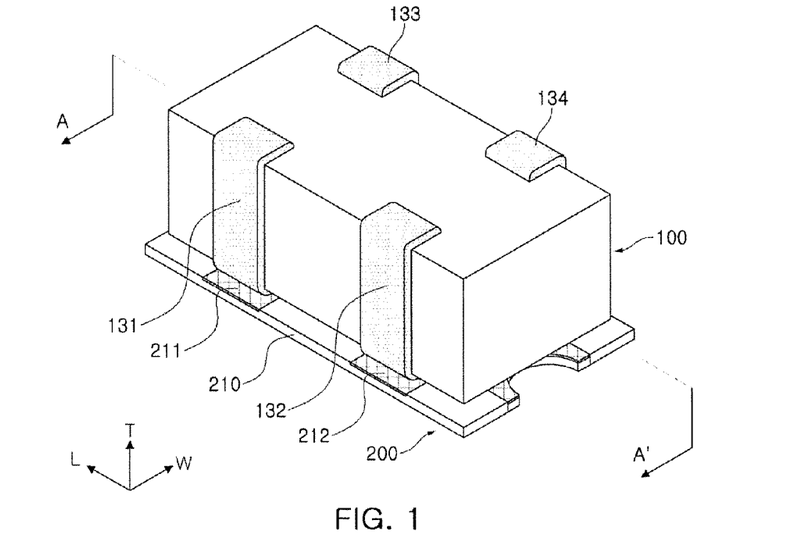
FIG. 1 is a perspective view of a multilayer ceramic electronic component according to an exemplary embodiment of the present disclosure.
Figure 2A:
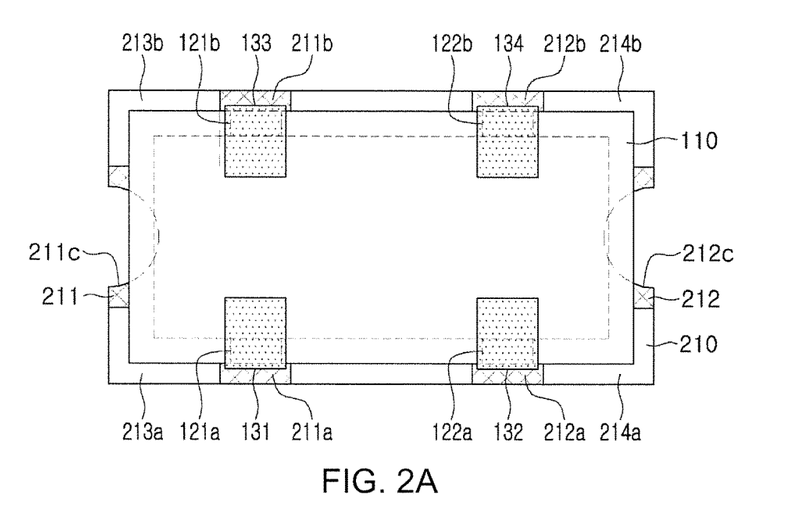
FIGS. 2A and 2B are plan views of the multilayer ceramic electronic component of FIG. 1.
Figure 2B:
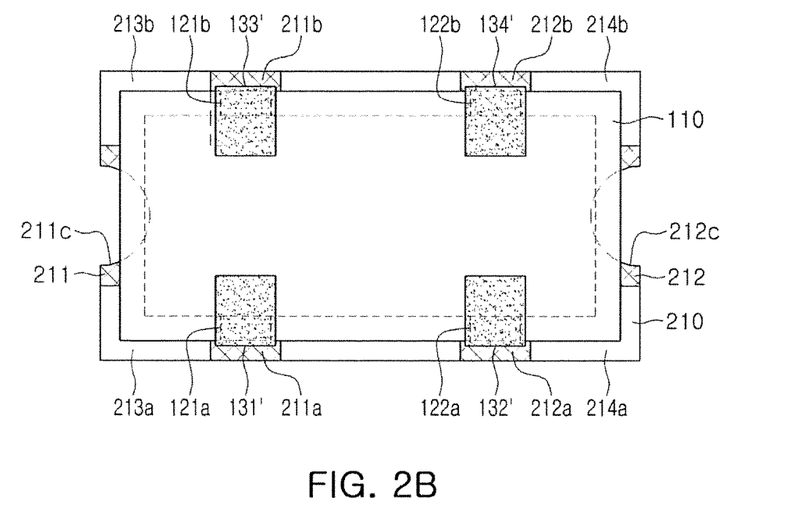

FIG. 1 is a perspective view of a multilayer ceramic electronic component according to an exemplary embodiment of the present disclosure, and FIGS. 2A and 2B are plan views of the multilayer ceramic electronic component of FIG. 1.

Referring to FIGS. 1 and 2A, the multilayer ceramic electronic component according to the exemplary embodiment of the present disclosure may include a multilayer ceramic capacitor 100; and an interposer substrate 200 including an insulation substrate 210 bonded to a mounting surface of the multilayer ceramic capacitor 100, and first and second connection terminals 211 and 212 formed on the insulation substrate 210 and connected to the first and second external electrodes 131 to 134 of the multilayer ceramic capacitor 100, respectively.

Here, the interposer substrate may be a member such as a sheet or a plate enabling fan-out or pad pitch expansion.

That is, the interposer substrate may substantially indicate a substrate for changing a pitch of an electrode terminal used at the time of mounting an electronic component on a circuit board. The electronic component and the mounting board may be electrically connected to each other by the interposer substrate.

Hereinafter, the multilayer ceramic capacitor 100 applied to the exemplary embodiment of the present disclosure will be described in detail.

The multilayer ceramic capacitor 100 according to the exemplary embodiment of the present disclosure may include a ceramic body 110, a pair of first external electrodes 131 and 133 and a pair of second external electrodes 132 and 134, and first and second internal electrodes 121 and 122.

The ceramic body 110 may be formed by stacking and then sintering a plurality of dielectric layers 111. In this case, a shape and a dimension of the ceramic body 110 and the number of stacked dielectric layers 111 are not limited to those of the exemplary embodiment of the present disclosure shown in the accompanying drawings.

In addition, the plurality of dielectric layers 111 configuring the ceramic body 110 may be in a sintered state. After the sintering process, the plurality of dielectric layers 111 may be integrated to be difficult to discern a boundary between the adjacent dielectric layers without using a scanning electron microscope (SEM).

The ceramic body 110 may be configured to include an active layer including the internal electrodes as a part contributing to forming capacitance of the capacitor and upper and lower cover layers formed on the upper and lower portions of the active layer, respectively, as upper and lower margin parts.

The upper and lower cover layers may have the same material and configuration as those of the dielectric layer 111 except that the internal electrodes are not included therein.

In addition, the upper and lower cover layers may be formed by stacking a single or two or more dielectric layers on upper and lower surfaces of the active layer in the thickness direction, respectively, and may basically serve to prevent the first and second internal electrodes 121 and 122 from being damaged by physical or chemical stress.

The active layer may be formed by repeatedly stacking the plurality of first and second internal electrodes 121 and 122 so as to be alternately exposed through both side surfaces of the ceramic body 110, having the dielectric layer 111 therebetween.

In this case, a thickness of the dielectric layer 111 may be optionally changed according to the capacitance design of the multilayer ceramic capacitor 100, but a thickness of a single dielectric layer may be in a range of 0.5 to 10.0 μm after sintering. However, the present disclosure is not limited thereto.

Further, the dielectric layer 111 may contain a ceramic powder having high permittivity, for example, a barium titanate ($BaTiO_3$)-based powder, a strontium titanate ($SrTiO_3$)-based powder, or the like, but the present disclosure is not limited thereto.

The first and second external electrodes 131 to 134 may be formed of a conductive paste containing a conductive metal, and the conductive metal may be nickel (Ni), copper (Cu), palladium (Pd), gold (Au), or an alloy thereof, but the present disclosure is not limited thereto.

In addition, a pair of the first external electrodes 131 and 133 and a pair of the second external electrodes 132 and 134 may be formed on both side surfaces of the ceramic body 110 so as to be spaced apart from each other in the length direction.

The first and second external electrodes 131 to 134 may absorb mechanical stress from the outside, or the like, to thereby prevent the ceramic body 110 and the first and second internal electrodes 121 and 122 from being damaged due to cracks, or the like.

In Referring to FIG. 2B, in this case, plating layers 131' to 134' may be further formed on surfaces of the first and second external electrodes 131 to 134, as needed. The plating may be performed using copper, nickel, gold, or the like, but the present disclosure is not limited thereto.

In addition, the first and second external electrodes 131 to 134 may be formed to be extended from both side surfaces of the ceramic body 110 to portions of the upper surface of the ceramic body 110.

Therefore, the multilayer ceramic capacitor 100 may have a vertically symmetrical structure, such that vertical directionality of the capacitor at the time of mounting the multilayer ceramic capacitor 100 on a board may be removed.

Figure 3:
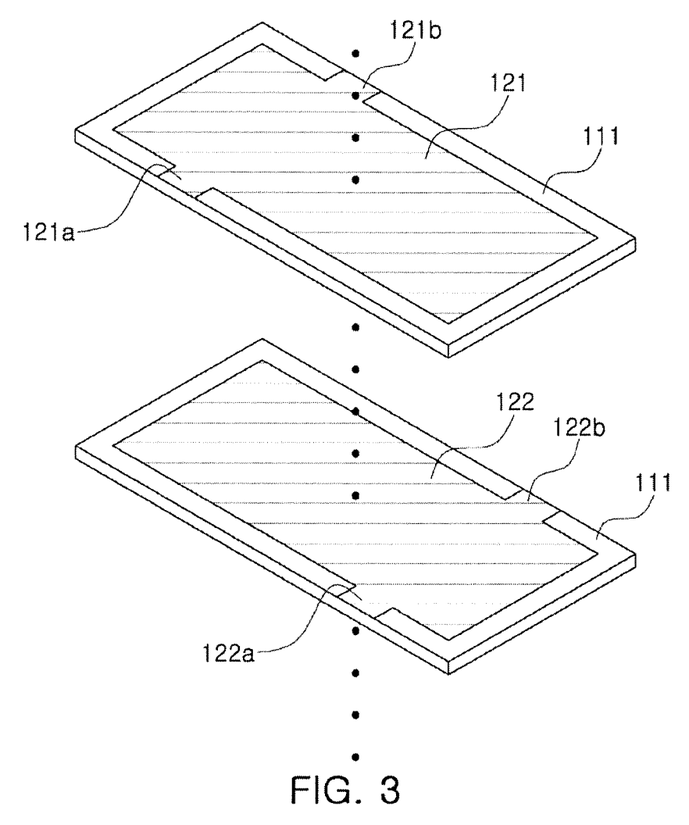
FIG. 3 is an exploded perspective view illustrating structures of first and second internal electrodes of the multilayer ceramic electronic component according to the exemplary embodiment of the present disclosure.

FIG. 3 is an exploded perspective view illustrating structures of the first and second internal electrodes of the multilayer ceramic electronic component according to the exemplary embodiment of the present disclosure.

Referring to FIG. 3, the first and second internal electrodes 121 and 122 may be electrodes having different polarities and may be formed by printing a conductive paste containing a conductive metal on the dielectric layer 111 to a predetermined thickness so as to be exposed to at least one side surface and be spaced apart from each other in a length direction of the ceramic body.

In the present exemplary embodiment, the first and second internal electrodes 121 and 122 may be electrically connected to the first and second external electrodes 131 and 132 formed on both side surfaces of the ceramic body 110 through pairs of lead-out portions 121a, 121b, 122a, and 122b exposed through the both side surfaces of the ceramic body 110, respectively, but the present disclosure is not limited thereto.

Therefore, when a voltage is applied to the first and second external electrodes 131 and 132, electric charges are accumulated between the first and second internal electrodes 121 and 122 facing each other. In this case, capacitance of the multilayer ceramic capacitor 100 may be in proportion to an area of an overlapped region between the first and second internal electrodes 121 and 122 in the active layer.

A thickness of the first and second internal electrodes 121 and 122 may be determined according to the use thereof. For example, the thickness may be determined to be in a range of 0.2 to 1.0 μm in consideration of a size of the ceramic body 110, but the present disclosure is not limited thereto.

Further, the conductive metal contained in the conductive paste forming the first and second internal electrodes 121 and 122 may be nickel (Ni), copper (Cu), palladium (Pd), or an alloy thereof, but the present disclosure is not limited thereto.

In addition, as a printing method of the conductive paste, a screen printing method, a gravure printing method, or the like, may be used, but the present disclosure is not limited thereto.

Interposer Substrate

Figure 4A:
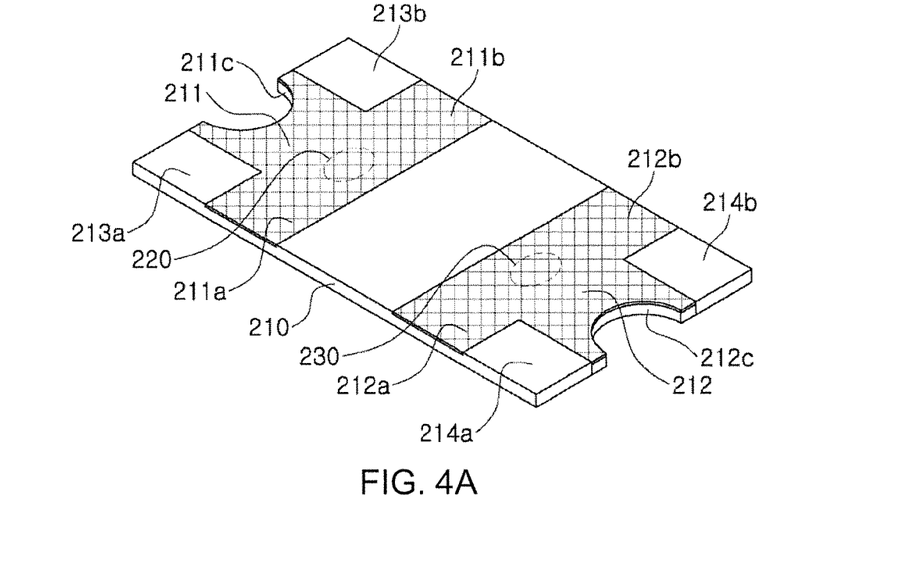
FIGS. 4A and 4B are plan views of an interposer substrate of the multilayer ceramic electronic component of FIG. 1.
Figure 4B:
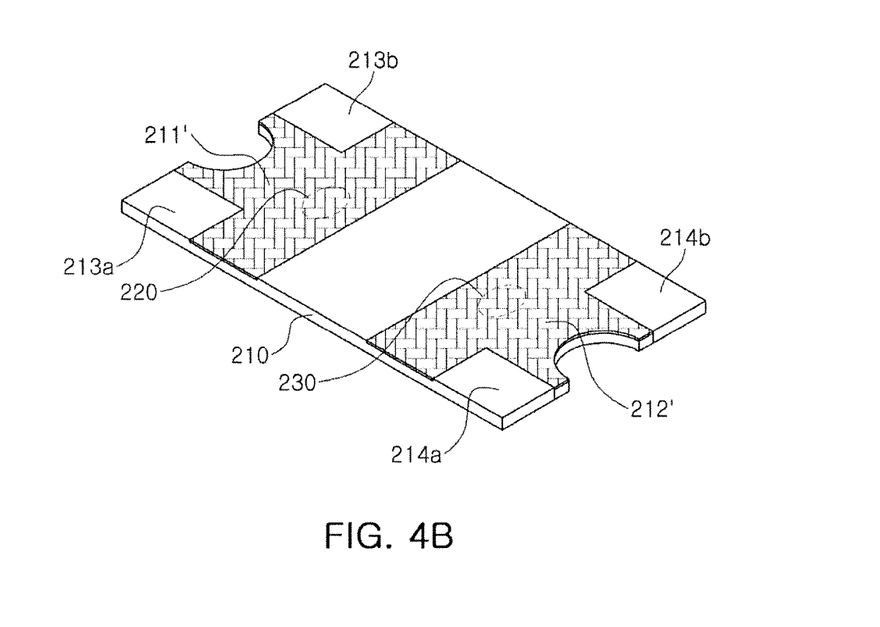
Figure 5:
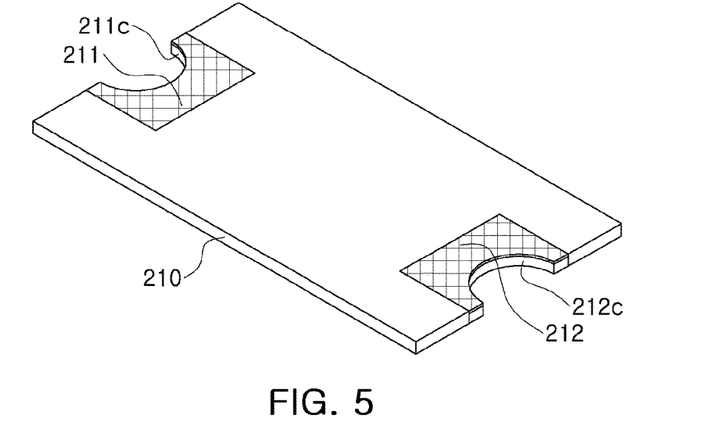
FIG. 5 is a bottom view of the interposer substrate of the multilayer ceramic electronic component of FIG. 1.

FIGS. 4A and 4B are plan views of an interposer substrate of the multilayer ceramic electronic component illustrated in FIG. 1, and FIG. 5 is a bottom view of the interposer substrate of the multilayer ceramic electronic component of FIG. 1.

Referring to FIGS. 4A and 5, in the case of the interposer substrate 200 included in the multilayer ceramic electronic component according to the present disclosure, first, an insulation substrate may be cut to have a predetermined size, and the first and second connection terminals 211 and 212 may be formed on the cut insulation substrate 210.

The first and second connection terminals 211 and 212 may include first connection portions 211a and 211b and second connection portions 212a and 212b spaced apart from each other on an upper surface of the insulation substrate 210 and connected to the first and second external electrodes 131 to 134, respectively; and first and second terminal portions extended from the first and second connection portions to both end surfaces of the insulation substrate 210 so as to be extended to a rear surface thereof. Portions of the first and second terminal portions formed on the rear surface of the insulation substrate 210 may be connected to a board so as to perform electrical connection therebetween.

Here, in the case of the first and second terminal portions, portions of the first and second connection portions 211a, 211b, 212a and 212b exposed to both end portions of the insulation substrate 210 may not be extended to the rear surface of the insulation substrate 210. A solder may be directly applied to the exposed portions of the first and second connection portions 211a, 211b, 212a and 212b, as needed.

Further, in the case of the first and second terminal portions, portions of the first and second connection portions 211a, 211b, 212a and 212b exposed to both end portions of the insulation substrate 210 may not be extended to the rear surface of the insulation substrate 210, but a through hole may be formed so that the electrode formed on an upper surface of the insulation substrate 210 and the rear surface thereof are connected to each other and may then be filled with a conductive paste to form a through electrode.

In addition, inwardly concave grooves 211c and 212c may be formed in portions of the first and second connection portions 211a, 211b, 212a and 212b exposed to the both end portions of the insulation substrate 210.

The grooves 211c and 212c may be a space receiving a solder at the time of mounting a capacitor on a board. Thus, an amount of overall solder may be reduced by accommodating a portion of the solder in the grooves 211c and 212c.

In addition, at least one corner part of the insulating substrate 210, for example, in the exemplary embodiment of the present disclosure with reference to FIG. 4, four corner parts of the insulating substrate 210 may be provided with margin parts 213a, 213b, 214a and 214b in which the connection terminals are not formed, respectively.

The margin parts 213a, 213b, 214a and 214b may significantly decrease an amount of solder applied thereto at the time of mounting a capacitor on the board.

In this case, the first and second connection terminals 211 and 212 may include a conductive layer formed by applying a conductive paste on a surface of the insulation substrate 210 and a conductive resin layer formed to cover the conductive layer.

In addition, if needed, the first and second connection terminals 211 and 212 may include first and second plating layers 211' and 212' formed by performing nickel plating, gold plating, and the like as shown in FIG. 4B.

In this case, since the multilayer ceramic capacitor 100 is attached to the interposer substrate 200 after the interposer substrate 200 is manufactured, the multilayer ceramic capacitor 100 may not be immersed in a plating solution at the time of plating the connection terminals of the interposer substrate 200.

Upper surfaces of the first and second connection portions 211a, 211b, 212a and 212b of the interposer substrate 200 may be provided with first and second conductive adhesion layers 220 and 230 so as to contact the mounting surface of the first and second external electrodes 131 and 132 of the multilayer ceramic capacitor 100 to thereby be adhered thereto. In this case, the first and second conductive adhesion layers 220 and 230 may be electrodes formed of a conductive resin or contain a high melting point solder.

Therefore, the multilayer ceramic capacitor 100 and the interposer substrate 200 may be mechanically bonded to each other in a state in which they are electrically connected to each other by the first and second conductive adhesion layers 220 and 230.

The interposer substrate 200 may serve to alleviate stress or vibrations due to piezoelectric properties of the multilayer ceramic capacitor 100 by elastic force of the insulation substrate 210, such that the intensity of the acoustic noise generated in the circuit board may be reduced.

Meanwhile, the insulation substrate 210 configuring the interposer substrate 200 may be formed to have an area smaller than that of the mounting surface of the multilayer ceramic capacitor 100. For example, a width of the insulation substrate 210 may be narrower than that of the ceramic body 110.

The interposer substrate 200 may have an area smaller than that of the mounting surface of the multilayer ceramic capacitor 100, and an area of a region of the insulation substrate 210 and a mounting board to which the stress of the multilayer ceramic capacitor 100 is transferred is decreased. Therefore, the intensity of acoustic noise may be further reduced.

In addition, since the interposer substrate 200 absorbs external mechanical stress and prevents bending of the mounting board, generation of cracks, or the like, in the multilayer ceramic capacitor 100 may be decreased.

Modified Example

Figure 6:
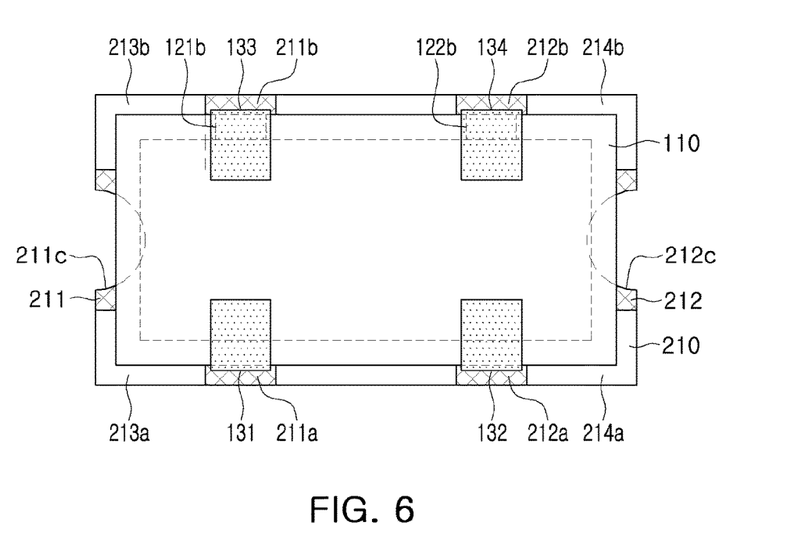
FIG. 6 is a plan view of a multilayer ceramic electronic component according to another exemplary embodiment of the present disclosure.
Figure 7:
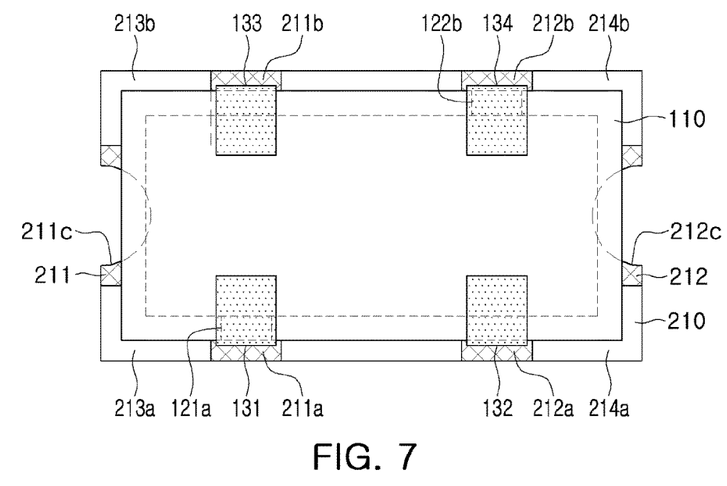
FIG. 7 is a plan view of a multilayer ceramic electronic component according to another exemplary embodiment of the present disclosure.

FIG. 6 is a plan view of a multilayer ceramic electronic component according to another exemplary embodiment of the present disclosure, and FIG. 7 is a plan view of a multilayer ceramic electronic component according to another exemplary embodiment of the present disclosure.

Referring to FIG. 6, the first internal electrode 121 of the multilayer ceramic capacitor 100 may only have the lead-out portion 121b thereof exposed to one side surface of the ceramic body 110 to be connected to a single first external electrode 133, and the second internal electrode 122 may only have the lead-out portion 122b exposed to one side surface of the ceramic body 110, the same side surface of the ceramic body to which the lead-out portion 121b of the first internal electrode 121 is exposed, so as to be connected to a single side second external electrode 134.

With respect to other features with reference to FIG. 6, a description of the components described in the above exemplary embodiments is omitted to avoid an overlapped description.

Referring to FIG. 7, the first internal electrode 121 of the multilayer ceramic capacitor 100 may have the lead-out portion 121a exposed to one side surface of the ceramic body 110 to be connected to a single side first external electrode 131, and the second internal electrode 122 may have the lead-out portion 122b exposed to the other side surface of the ceramic body 110 to be connected to a single side second external electrode 134 so as to oppose the lead-out portion 121a of the first internal electrode 121 in a diagonal direction.

With respect to other features with reference to FIG. 7, a description of the components described in the above exemplary embodiments is omitted to avoid an overlapped description.

Board Having Multilayer Ceramic Electronic Component Mounted Thereon

Figure 8:
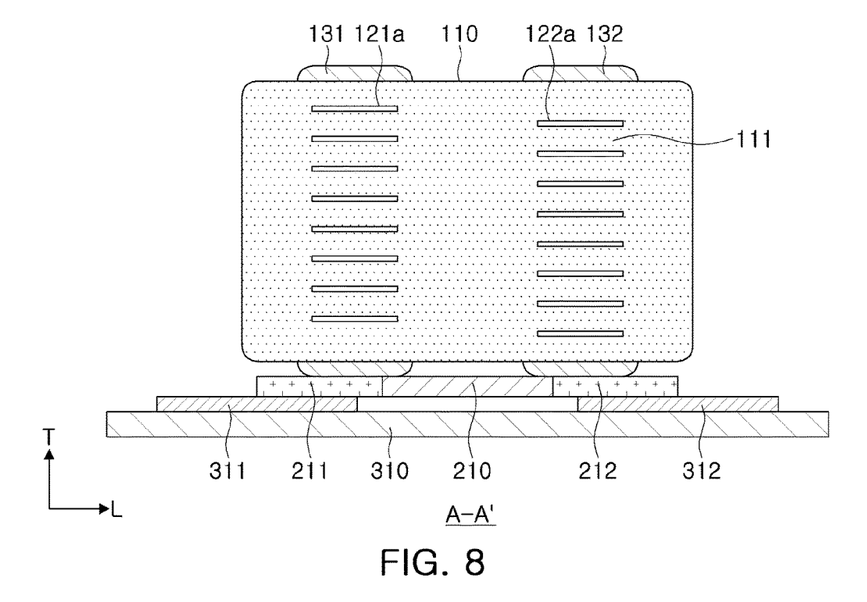
FIG. 8 is a cross-sectional view illustrating the multilayer ceramic electronic component of FIG. 1 mounted on a board and taken in a length direction.

FIG. 8 is a cross-sectional view illustrating the multilayer ceramic electronic component of FIG. 1 mounted on the board and taken in a length direction.

Referring to FIG. 8, the board having a multilayer ceramic electronic component mounted thereon according to an exemplary embodiment of the present disclosure may include a board 310 on which the multilayer ceramic electronic component is horizontally mounted and first and second electrode pads 311 and 312 formed on the board 310 to be spaced apart from each other.

In this case, the multilayer ceramic electronic component may be electrically connected to the board 310 in a state in which the interposer substrate 200 is disposed below the multilayer ceramic electronic component, and the first and second terminal portions of the first and second connection terminals 211 and 212 positioned on a lower surface of the insulation substrate 210 are positioned on and attached to the first and second electrode pads 311 and 312 so as to contact each other.

When voltage is applied in a state in which the multilayer ceramic electronic component is mounted on the circuit board 310, acoustic noise may be generated.

In this case, sizes of the first and second electrode pads 311 and 312 may determine an amount of a solder connecting the first and second external electrodes 131 and 132 of the multilayer ceramic capacitor 100, the first and second connection terminals 211 and 212 of the interposer substrate 200, and the first and second electrode pads 311 and 312 to each other, and the intensity of the acoustic noise may be adjusted according to the amount of this solder.

According to exemplary embodiments of the present disclosure, stress or vibrations due to piezoelectric properties of a multilayer ceramic capacitor may be alleviated by elastic force of an interposer substrate, such that intensity of acoustic noise generated in the circuit board may be reduced.

In addition, even when an amount of solder is increased at the time of mounting a multilayer ceramic capacitor on a circuit board, a problem that the solder rises up along an external electrode of the multilayer ceramic capacitor may be prevented, thereby blocking piezoelectric stress from being directly transferred from the multilayer ceramic capacitor to the board through the external electrodes. Therefore, acoustic noise may be further reduced.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component comprising:
   a multilayer ceramic capacitor including
      a ceramic body in which a plurality of dielectric layers are stacked,
      a pair of first external electrodes disposed on first and second side surfaces of the ceramic body, respectively,
      a pair of second external electrodes disposed on the first and second side surfaces of the ceramic body, respectively, wherein one of the first external electrodes and one of the second external electrodes disposed on the first side surface are spaced apart from each other in a length direction of the ceramic body and extended to portions of a mounting surface of the ceramic body, and
      first and second internal electrodes alternately stacked in the ceramic body, exposed through at least one of the first and second side surfaces of the ceramic body, and connected to one of the first and second external electrodes, one of the plurality of dielectric layers being disposed between the first and second internal electrodes; and
   an interposer substrate including
      an insulation substrate connected to the mounting surface of the multilayer ceramic capacitor, and
      first and second connection terminals disposed on the insulation substrate and connected to the first and second external electrodes, respectively,
   wherein the first and second connection terminals of the interposer substrate comprise:
      first and second connection portions disposed on an upper surface of the insulation substrate so as to be connected to the first and second external electrodes, respectively; and
      first and second terminal portions extended from a center of the first and second connection portions to a part of a lower surface of the insulation substrate through surfaces of the insulation substrate opposing each other in a length direction of the insulation substrate, respectively, and
   wherein each of the first and second connection portions extends to both opposing edges of the insulation substrate in a width direction of the insulation substrate orthogonal to the length direction of the insulation substrate, and corner parts of the insulation substrate between the first and second connection portions and the first and second terminal portions are provided with margins.

2. The multilayer ceramic electronic component of claim 1, wherein the corner parts of the insulation substrate between the first and second connection portions and the first and second terminal portions are provided with the margins in which the first and second connection terminals are not formed.

3. The multilayer ceramic electronic component of claim 1, wherein the first and second connection terminals comprise conductive adhesion layers formed on the first and second connection portions.

4. The multilayer ceramic electronic component of claim 3, wherein the conductive adhesion layers contain a conductive resin.

5. The multilayer ceramic electronic component of claim 3, wherein the conductive adhesion layers contain a high melting point solder.

6. The multilayer ceramic electronic component of claim 1, wherein the first and second connection terminals are exposed to both ends of the insulation substrate.

7. The multilayer ceramic electronic component of claim 1, wherein the first and second connection terminals are exposed to both ends of the insulation substrate and have grooves depressed inwardly from both ends of the insulation substrate.

8. The multilayer ceramic electronic component of claim 1, wherein the first and second connection terminals comprise plating layers formed on the first and second terminal portions.

9. The multilayer ceramic electronic component of claim 8, wherein the plating layers of the first and second terminal portions comprise a nickel plating layer and a gold plating layer formed in sequence.

10. The multilayer ceramic electronic component of claim 1, wherein the multilayer ceramic capacitor comprises plating layers formed on the first and second external electrodes.

11. The multilayer ceramic electronic component of claim 1, wherein in the multilayer ceramic capacitor, the first and second internal electrodes have two lead-out portions exposed to both side surfaces of the ceramic body, respectively.

12. The multilayer ceramic electronic component of claim 1, wherein in the multilayer ceramic capacitor, the first and second internal electrodes have lead-out portions exposed to both side surfaces of the ceramic body to oppose each other in a diagonal direction of the ceramic body.

13. The multilayer ceramic electronic component of claim 1, wherein the multilayer ceramic capacitor comprises upper and lower cover layers formed on upper and lower surfaces of the ceramic body, respectively.

14. The multilayer ceramic electronic component of claim 1, wherein the interposer substrate has an area smaller than that of the mounting surface of the multilayer ceramic capacitor.

15. A board having a multilayer ceramic electronic component mounted thereon, the board comprising:
   a substrate having first and second electrode pads formed on the substrate; and
   a multilayer ceramic electronic component mounted on the substrate,
   wherein the multilayer ceramic electronic component includes:
      a multilayer ceramic capacitor including a ceramic body in which a plurality of dielectric layers are stacked,
      a pair of first external electrodes disposed on first and second side surfaces of the ceramic body, respectively,
      a pair of second external electrodes disposed on the first and second side surfaces of the ceramic body, respectively,
      wherein one of the first external electrodes and one of the second external electrodes disposed on the first side surface are spaced apart from each other in a length direction of the ceramic body and extended to portions of a mounting surface of the ceramic body, and first and second internal electrodes alternately stacked in the ceramic body, exposed through at least one of the first and second side surfaces of the ceramic body, and connected to one of the first and second external electrodes, one of the plurality of dielectric layers being disposed between the first and second internal electrodes; and an interposer substrate including an insulation substrate connected to the mounting surface of the multilayer ceramic capacitor and first and second connection terminals disposed on the insulation substrate and having upper surfaces connected to the first and second external electrodes, respectively, and lower surfaces connected to the first and second electrode pads, respectively, wherein the first and second connection terminals of the interposer substrate comprise:

first and second connection portions disposed on an upper surface of the insulation substrate so as to be connected to the first and second external electrodes, respectively; and first and second terminal portions extended from a center of the first and second connection portions to a part of a lower surface of the insulation substrate through surfaces of the insulation substrate opposing each other a length direction of the insulation substrate, respectively, and wherein each of the first and second connection portions extends to both opposing edges of the insulation substrate in a width direction of the insulation substrate orthogonal to the length direction of the insulation substrate, and corner parts of the insulation substrate between the first and second connection portions and the first and second terminal portions are provided with margins.

16. The board of claim 15, wherein the corner parts of the insulation substrate between the first and second connection portions and the first and second terminal portions are provided with the margins in which the first and second connection terminals are not formed.

17. The board of claim 15, wherein the first and second connection terminals comprise conductive adhesion layers formed on the first and second connection portions.

18. The board of claim 17, wherein the conductive adhesion layers contain a conductive resin.

19. The board of claim 17, wherein the conductive adhesion layers contain a high melting point solder.

20. The board of claim 15, wherein the first and second connection terminals are exposed to both ends of the insulation substrate.

21. The board of claim 15, wherein the first and second connection terminals are exposed to both ends of the insulation substrate and have grooves depressed inwardly from both ends of the insulation substrate.

22. The board of claim 15, wherein the first and second connection terminals include plating layers formed on the first and second terminal portions.

23. The board of claim 22, wherein the plating layers of the first and second terminal portions include a nickel plating layer and a gold plating layer formed in sequence.

24. The board of claim 15, wherein the multilayer ceramic capacitor includes plating layers formed on the first and second external electrodes.

25. The board of claim 15, wherein in the multilayer ceramic capacitor, the first and second internal electrodes have two lead-out portions exposed to both side surfaces of the ceramic body, respectively.

26. The board of claim 15, wherein in the multilayer ceramic capacitor, the first and second internal electrodes have lead-out portions exposed to both side surfaces of the ceramic body to oppose each other in a diagonal direction of the ceramic body.

27. The board of claim 15, wherein the multilayer ceramic capacitor includes upper and lower cover layers formed on upper and lower surfaces of the ceramic body, respectively.

28. The board of claim 15, wherein the interposer substrate has an area smaller than that of the mounting surface of the multilayer ceramic capacitor.

* * * * *